United States Patent [19]

Lin

[11] Patent Number: 5,660,562

[45] Date of Patent: Aug. 26, 1997

[54] CPU HEAT DISSIPATOR HOOK-UP DEVICE

[76] Inventor: Chuen-Sheng Lin, No. 31, Sec. 1, Min Yi Road, Wu Ku Hsiang, Taipei Hsien, Taiwan

[21] Appl. No.: 495,839

[22] Filed: Jun. 28, 1995

[51] Int. Cl.⁶ .................................................... H01R 13/00
[52] U.S. Cl. ............................................ 439/487; 361/704
[58] Field of Search .................................. 439/487, 330, 439/331, 525, 607, 73; 361/383, 386–389, 413, 704

[56] References Cited

U.S. PATENT DOCUMENTS

| | | | |
|---|---|---|---|
| 5,123,850 | 6/1992 | Elder et al. | 439/487 |
| 5,241,453 | 8/1993 | Bright et al. | 439/487 |
| 5,282,111 | 1/1994 | Hopfer | 439/487 |
| 5,357,404 | 10/1994 | Bright et al. | 439/607 |

*Primary Examiner*—Hien Vu
*Attorney, Agent, or Firm*—Browdy and Neimark

[57] ABSTRACT

The present invention is to provide a CPU heat dissipator hook-up structure having a metal pressing board and a metal hook-up board. The two sides of the metal pressing board stretch upward and formed an elastic tilt angle. There, on one side of the metal pressing board is bent downward and form an open, while the other side of the metal pressing board is formed two separate recesses. The top end of the metal hook-up board formed a flat surface as the force applied to when hooking up downward with the ZIF socket. Also on the two sides of the metal hook-up board formed a recess separately to be inserted by the protrusion formed because of the recess of the metal pressing board while being assembled. On the bottom of the metal hook-up board there is an open formed to be hooked by the hook formed on the side of the ZIF socket. Thus, using the upward elasticity of the metal pressing board, the dissipator board and he CPU can be fixed together tightly and achieve the purpose of ventilation. Also the present invention is to provide a non-fined area on the dissipator board so as to that the metal pressing board can be put across the dissipator board and be buckled up with the hook on the ZIF socket, therefore, the present invention can be used in all kinds of dissipator.

1 Claim, 4 Drawing Sheets

CPU HEAT DISSIPATOR HOOK-UP DEVICE

FIELD OF THE INVENTION

The present invention relates generally to a computer processor unit CPU heat dissipator hook-up means and in particular to a dissipator hook up device comprising a metal pressing board and metal hook up board to which the dissipator and the CPU can be easily hooked up onto the ZIF socket.

BACKGROUND OF THE INVENTION

FIG. 1 shows a conventional CPU dissipator hook up device used with a ZIF socket. The exploded view of this hook up device, shows a pressing board 11 formed inward on the rim of the frame 1. The left and the right side of the frame 1 show hook plates 12, and the front and the rear side show blocking boards 13. At the end of the hook plate 12, a hook 121 is formed. The frame 1 must be assembled with the hook plates 12 facing upward. When engaging boards 1, 2 and 3 together, the frame 1 is placed between the ZIF socket 2 and the CPU 3 and the surrounding shoulder of the CPU 3 is placed onto the pressing board 11. When the CPU 3 is engaged on the ZIF socket 2, the frame 1 is then fixed in between. After boards 1, 2 and 3 are secured, the dissipator board 4 is put on the surface of the CPU 3 and is secured on both sides by the hooks 121 of the frame 1.

This assembly procedure is so complicated that whoever is not familiar with it will have difficulty determining how these boards are assembled. Further, the plastic-made frame 1 is a poor heat conductor. When operating, the generated heat from the CPU the will not only deform the plastic-made frame 1 but cause the dissipator board 4 to fail and will affect the clamping devices between the boards.

OBJECTIVES OF THE INVENTION

Therefore, to provide an effective CPU ventilator hook-up device, the main objective of the present invention is to provide a dissipator hook-up device having a metal pressing board and a metal hook-up board. A first and second portion are bent upward from a center portion of the metal pressing board to form resilient angles with the center portion. A first engagement arm is bent downward from the outer end of the first portion of the pressing board and is formed with an opening to engage a first hook on the ZIF socket. The outer end of the second portion of the metal pressing board has a T-shaped slot having a round hole at one end and is open to an edge of the second portion.

The top end of the metal hook-up board has a flat surface portion where a force can be applied when hooking up the hook-up board to a second hook on the ZIF socket. The metal hook-up board also has a second engagement arm integrally formed with the flat surface portion which can be inserted into the T-shaped slot on the metal pressing board when being assembled. The second engagement arm has a notch on each side edge which engages the T-shaped slot when the engagement arm is inserted into the slot. At the bottom of the second engagement arm of the metal hook-up board there is another opening formed to engage the second hook formed on the ZIF socket. Thus, when the pressing and hook-up boards are engaged to each other, the dissipator board and the CPU can be fixed together tightly and achieve superior ventilation due to the resilience of the pressing and hook-up boards.

Another objective of this invention is to provide unfinned area on the CPU board dissipator so that the metal pressing board can be placed across the dissipator board so that it and the hook-up board can be engaged to the hooks on the ZIF socket. Accordingly, no matter how high the fins on the dissipator board may be, the present invention can always be used.

Still, another objective of the invention is to provide a metal hook-up device with which the effect of dissipation of heat generated by CPU will be greatly increased.

SUMMARY OF THE INVENTION

The present invention is to provide a dissipator hook-up device having a metal pressing board and a metal hook-up board. A first and second portion of the metal pressing board are bent upward from a center portion to form resilient angles with the center portion. A first engagement arm is bent downward from the outer end of the first portion of the pressing board and is provided with an opening to engage a first hook on the ZIP socket. The outer end of the second portion is formed with a T-shaped recess open to an edge of the second portion. The top end of the metal hook-up board has a flat surface portion on which a force can be applied when engaging the hook-up board to a second hook on the ZIF socket. The metal hook-up board also has a second engagement arm formed with the flat surface portion which can be inserted into the T-shaped slot of the metal pressing board while being assembled. The second engagement arm has a notch on each edge which engages edges of the T-shaped slot when the second engagement arm is inserted into the slot. On the bottom of the second engagement arm an opening is formed to engage with a second hook formed on the side of the ZIF socket. Thus, the resilience of the metal pressing board, permits the dissipator board and the CPU to be fixed together tightly and achieve superior ventilation. Also the present invention has a unfinned area on the dissipator board so that the metal pressing board can be placed across the dissipator board and it and the hook-up board engaged to the hooks on the ZIF socket.

BRIEF DESCRIPTION OF THE DRAWINGS

The present invention will be better understood from the following description of preferred embodiments of the present invention, with reference to the attached drawings, wherein.

DETAILED DESCRIPTION OF THE PREFERRED EMBODIMENTS

Figure 1:
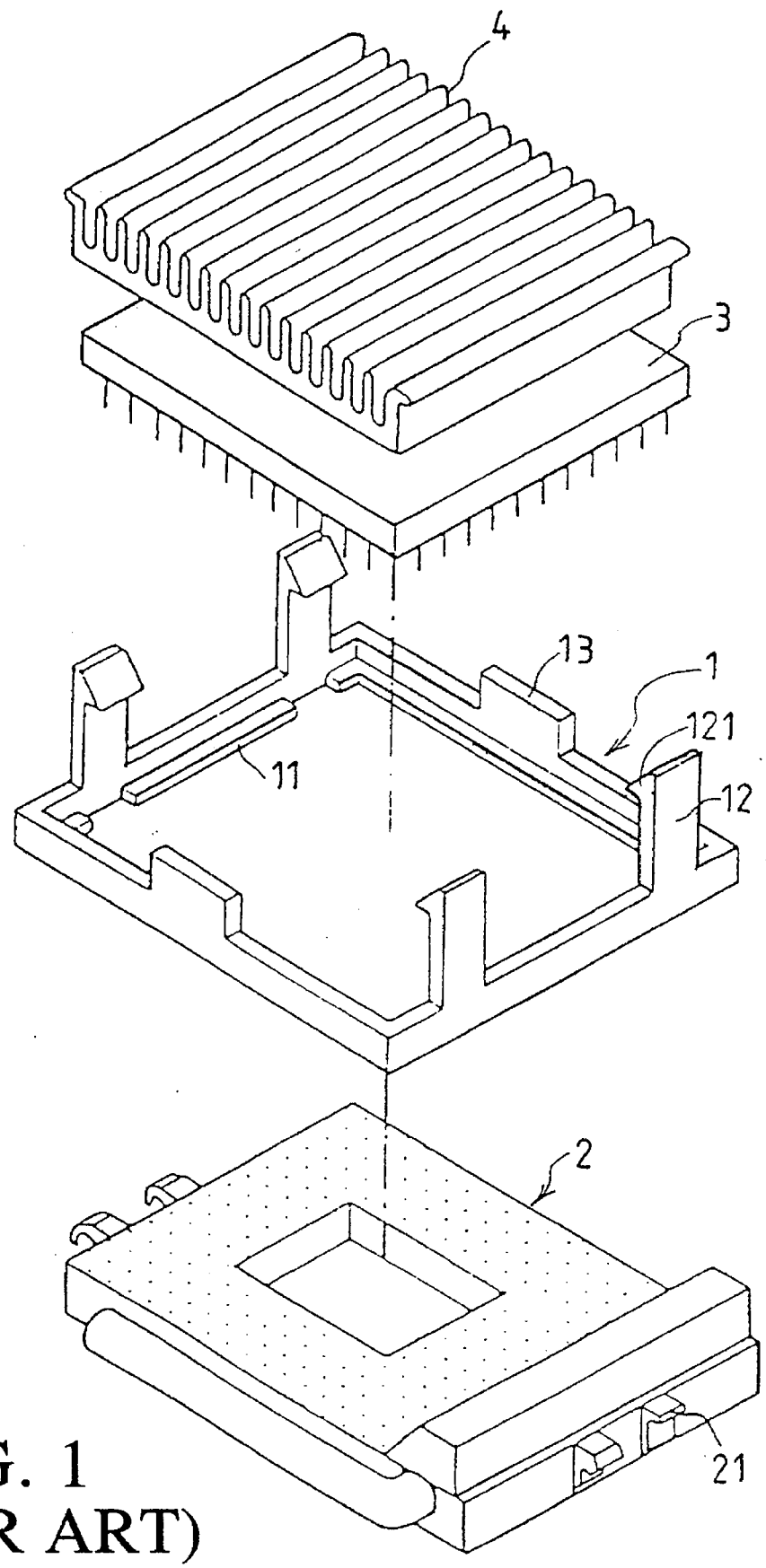
FIG. 1 is an exploded view of an prior art hook-up device applied to the ZIF socket.
Figure 2:
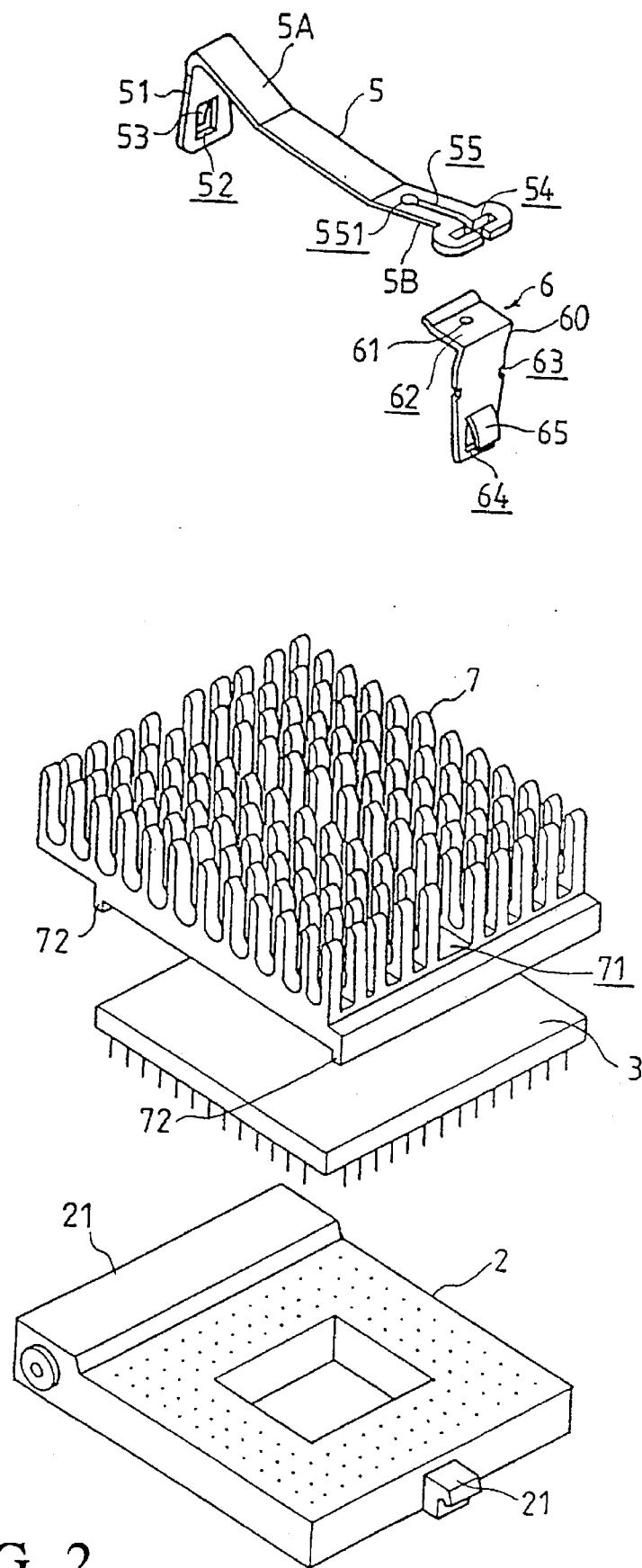
FIG. 2 is an exploded view of the present invention showing the detail features of the hook-up device.
Figure 3:
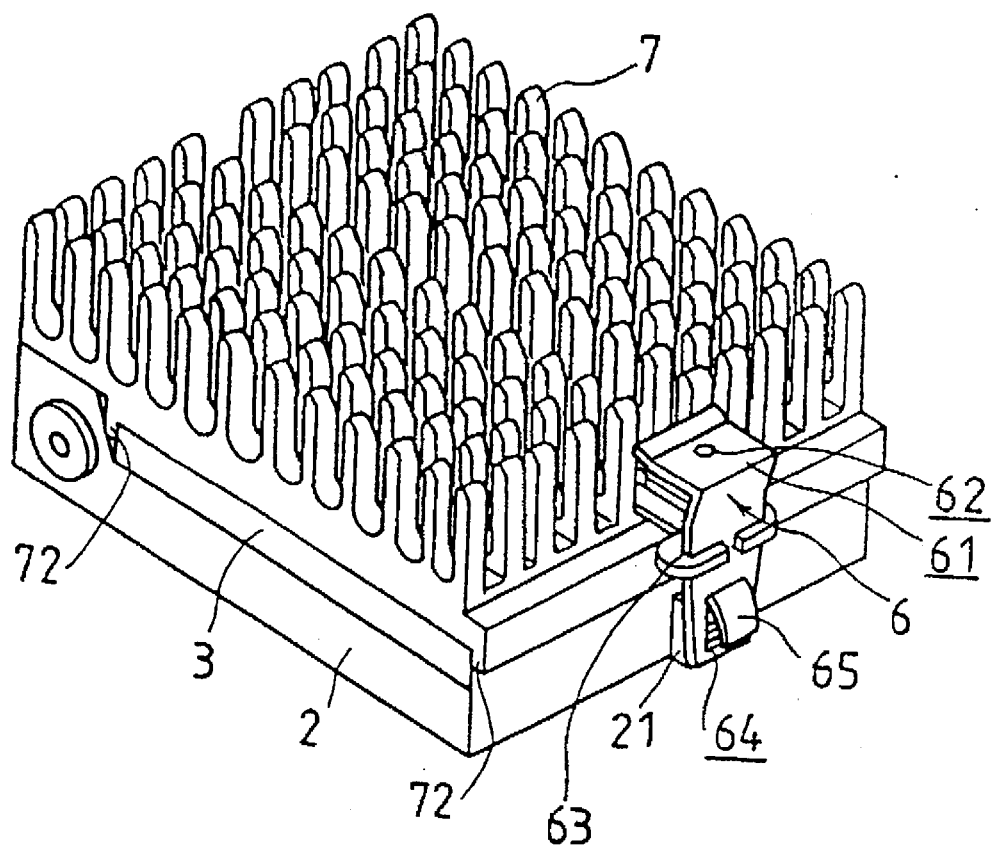
FIG. 3 is a perspective view of the present invention showing all the boards assembled together with the hook-up device.
Figure 4:
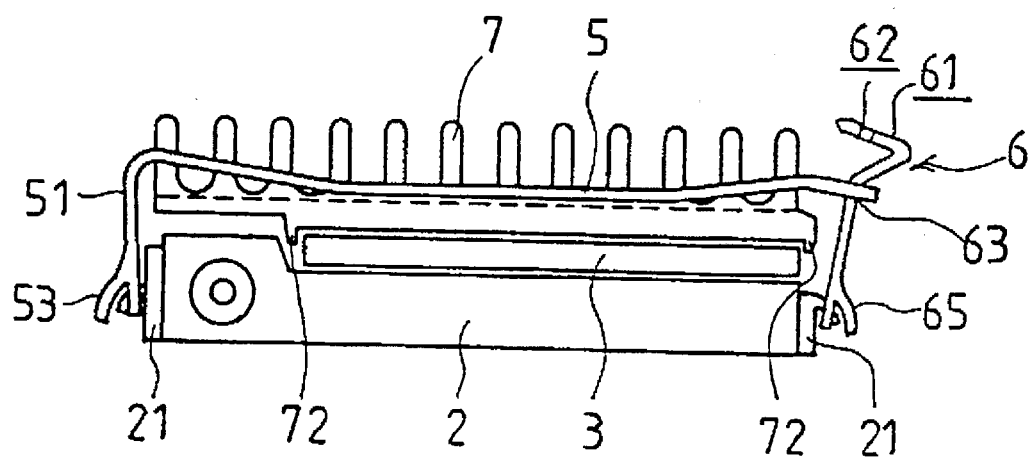
FIG. 4 is a side view of the present invention in accordance with FIG. 3.

FIGS. 2-4 show the hook-up device according to the invention comprising a metal pressing board 5 and a metal hook-up board 6. First portion 5A and second portion 5B of the metal pressing board 5 are each bent upward to form a resilient angle with board 5. On the outer end of the first portion 5A, an engagement arm 51 with an opening 52 is bent downward from the surface of the metal pressing board 5. Opening 52 is intended to engage one of the hooks 21 formed on ZIF socket 2. A metal tab 53 on engagement arm 51 projects down and over the opening 52 to protect the hook 21 on the ZIF socket 2 from breaking when hook 21 is engaged in opening 52. On the outer end of the second portion 5B of metal pressing board 5 a T-shaped slot 54, 55 is provided which extends through the metal pressing board 5 and has a round hole 551 on one end, as shown in FIG. 2.

The metal hook-up board 6 has a flat surface portion 62 on the top end for applying force when the hook-up device is buckled down with the ZIF socket 2. On the flat surface 62, a round hole 61 is formed to permit use of an auxiliary pin-like tool (not shown) to apply force to flat surface 62. A second engagement arm 60 is formed as a unit with flat surface portion 62 at an angle. Second engagement arm 60 is engageable with slot 54 on the metal pressing board 5 until notches 63 on engagement arm 60 engage the edges of the second portion 5B as shown in FIGS. 3 and 4. At the bottom of the second engagement arm 60 of the metal hook-up board 6, an opening 64 is provided for engaging a second hook 21 on the ZIF socket 2. A metal tab 65 projects down and over opening 64 to protect the hook 21 on the ZIF socket 2 from breaking when engaged in opening 64.

An unfinned area 71 on the finned dissipator board 7 is formed to permit the metal hook-up board 5 to cross over and engage dissipator board 7, and permit engagement of the first hooks 21 on the ZIF socket 2 with openings 52, 64. Accordingly, no matter what the height of the fins on finned board 7 are, the present invention can always be used.

Referring to FIG. 3 and FIG. 4, when assembling boards 2, 3 and 7 together, the CPU 3 is first inserted into the ZIF socket 2. Then the dissipator board is 7 placed on top of the CPU 3. The projections 72 on the bottom of the dissipator board 7 are spaced apart so as to preclude the sides of the CPU 3 from sliding. Inserting the second engagement arm 60 formed on the metal hook-up board 6 into recess 54 until notches 63 engage the edges of pressing board 5 makes the boards 5, 6 a complete buckling device. After the opening 52 of the metal pressing board 5 is engaged on the first hook 21 of the ZIF socket 2 and the metal pressing board 5 is lying on the unfinned area 71, the surface 62 of the metal hook-up board 6 is pressed by either a finger or an auxiliary pin-like tool placed in hole 61, thereby engaging opening 64 on the second hook 21 of the ZIF socket 2. Because of the force on both ends of the metal pressing board 5 when pressing, the resilient angles of the metal pressing board 5 are deformed. When the force applied on the metal pressing board 5 is relieved and both hooks 21 engaged, the ends of the metal pressing board 5 spring up and are restored back to their original shape. This completes the assemble of CPU 3 with the dissipator board 7.

When disassembling, a little pressure is applied on the surface 62 of the metal hook-up board 6 and the board 6 is turned outward. This will result in the opening 64 of the metal hook-up board 6 separating from the second hook 21 of the ZIF socket 2 permitting the CPU 3 to be separated from the dissipator board 7.

It is apparent that although the invention has been described in connection with the above embodiment, it is contemplated that those skilled in the art make changes to the preferred embodiment without departing from the scope of the invention as defined in the appended claims.

What is claimed is:

1. A computer processor unit (CFU) hook-up device for engaging a dissipator board and a computer processor unit to a ZIF socket, said ZIF socket having a first hook and a second hook and said dissipator board having an unfinned area, said CPU hook-up device comprising:

a metal pressing board, and a metal hook-up board, said metal pressing board comprising a center portion and a first portion and a second portion extending outwardly from ends of the center portion, said first portion and said second portion each being bent from maid center portion to form a resilient angle with said center portion, a first engagement arm extending from an outer end of said first portion and being bent downwardly, said first engagement arm having a first opening adapted to be engaged to said first hook on said ZIF socket, a first metal tab extending from an edge of said first opening and being bent to cover and protect said first hook when engaged in said first opening, a slot in said second portion, said slot opening to an edge on said second portion, said metal hook-up board comprising a first end portion having a flat surface and a second end portion having a second engagement arm, said first end and said second end portions formed as a unit, said second end portion being bent down from said first end portion, said second engagement arm having a second opening adapted to be engaged to said second hook on said ZIF socket and a notch on each side edge of said second engagement arm, a second metal tab extending from an edge of said second opening and being bent to cover and protect said second hook when engaged in said second opening, wherein when said CPU hook-up device is used to engage said dissipator board over said computer processor unit to the ZIF socket, said second engagement arm is engaged in said slot wherein said notches of said second engagement arm are engaged with edges of said slot, said metal pressing board and said metal hook-up board are positioned in said unfinned area of said dissipator board and said metal pressing board and said metal hook up board are engaged to each other and to said first hook and said second hook on said ZIF socket so that the dissipator board and the CDU can be fixed together tightly and achieve superior ventilation due to the resilience of the metal pressing board and the metal hook-up boards.

* * * * *